US012230551B2

(12) United States Patent
Jeon et al.

(10) Patent No.: US 12,230,551 B2
(45) Date of Patent: Feb. 18, 2025

(54) IMMERSION DIRECT COOLING MODULES

(71) Applicant: SEMICONDUCTOR COMPONENTS INDUSTRIES, LLC, Phoenix, AZ (US)

(72) Inventors: Oseob Jeon, Seoul (KR); Youngsun Ko, Incheon (KR); Seungwon Im, Seoul (KR); Jerome Teysseyre, Scottsdale, AZ (US); Michael J. Seddon, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 452 days.

(21) Appl. No.: 17/664,549

(22) Filed: May 23, 2022

(65) Prior Publication Data

US 2022/0406684 A1 Dec. 22, 2022

Related U.S. Application Data

(60) Provisional application No. 63/202,557, filed on Jun. 16, 2021.

(51) Int. Cl.
*H05K 7/20* (2006.01)
*H01L 21/48* (2006.01)
*H01L 23/44* (2006.01)

(52) U.S. Cl.
CPC .......... *H01L 23/44* (2013.01); *H01L 21/4882* (2013.01); *H05K 7/20927* (2013.01)

(58) Field of Classification Search
CPC .................. H05K 7/20927; H01L 21/4882
USPC .................................... 257/712, 717
See application file for complete search history.

(56) References Cited

U.S. PATENT DOCUMENTS

| | | | |
|---|---|---|---|
| 5,905,299 A * | 5/1999 | Lacap | H01L 23/3107 257/676 |
| 7,911,792 B2 | 3/2011 | Liang et al. | |
| 8,680,666 B2 | 3/2014 | Hauenstein | |
| 10,194,559 B2 | 1/2019 | Saito | |
| 2007/0145540 A1 | 6/2007 | Mochida | |
| 2009/0160046 A1 | 6/2009 | Otremba et al. | |
| 2014/0145319 A1 | 5/2014 | Meinhold et al. | |
| 2018/0286702 A1 | 10/2018 | Kawashima et al. | |
| 2019/0333909 A1 | 10/2019 | Sugita et al. | |
| 2020/0098870 A1 | 3/2020 | Estacio et al. | |

FOREIGN PATENT DOCUMENTS

| | | |
|---|---|---|
| JP | 200557130 A | 3/2005 |
| JP | 2013179104 A | 9/2013 |

* cited by examiner

*Primary Examiner* — Hoai V Pham
(74) *Attorney, Agent, or Firm* — IPTechLaw

(57) ABSTRACT

Implementations of a semiconductor package may include one or more semiconductor die directly coupled to only a direct leadframe attach (DLA) leadframe including two or more leads; and a coating covering the one or more semiconductor die and the DLA leadframe where when the semiconductor package is coupled into an immersion cooling enclosure, the coating may be in contact with a dielectric coolant while the two or more leads extend out of the immersion cooling enclosure.

16 Claims, 12 Drawing Sheets

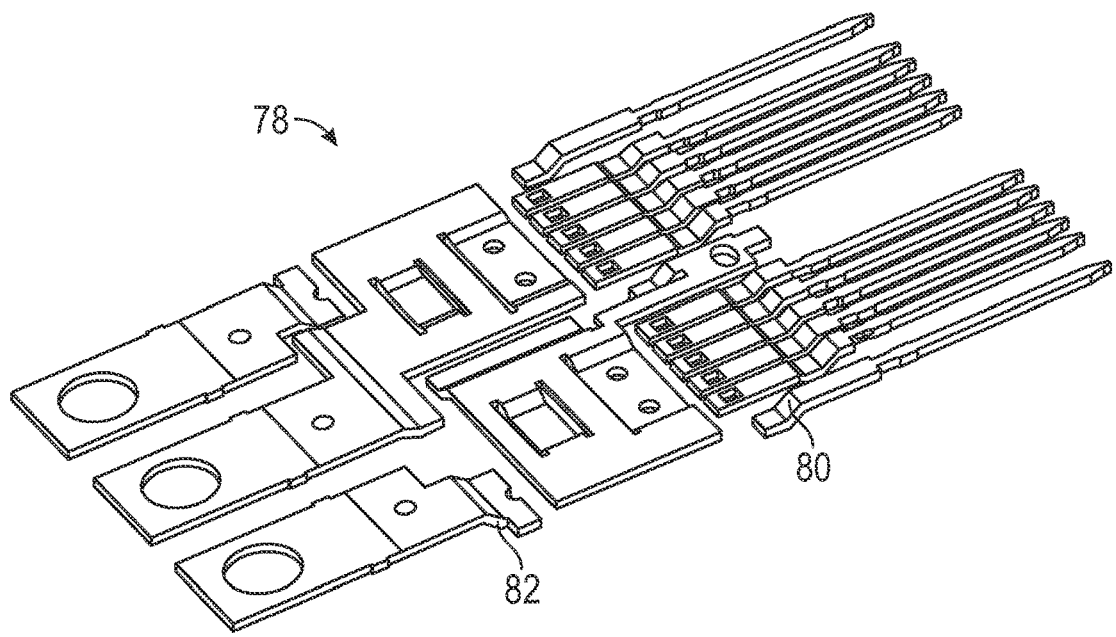
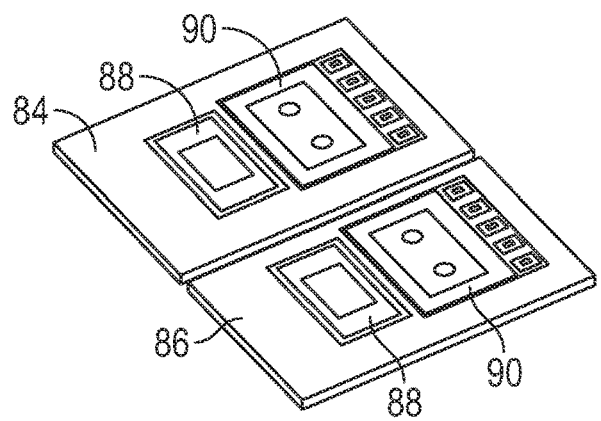
FIG. 9
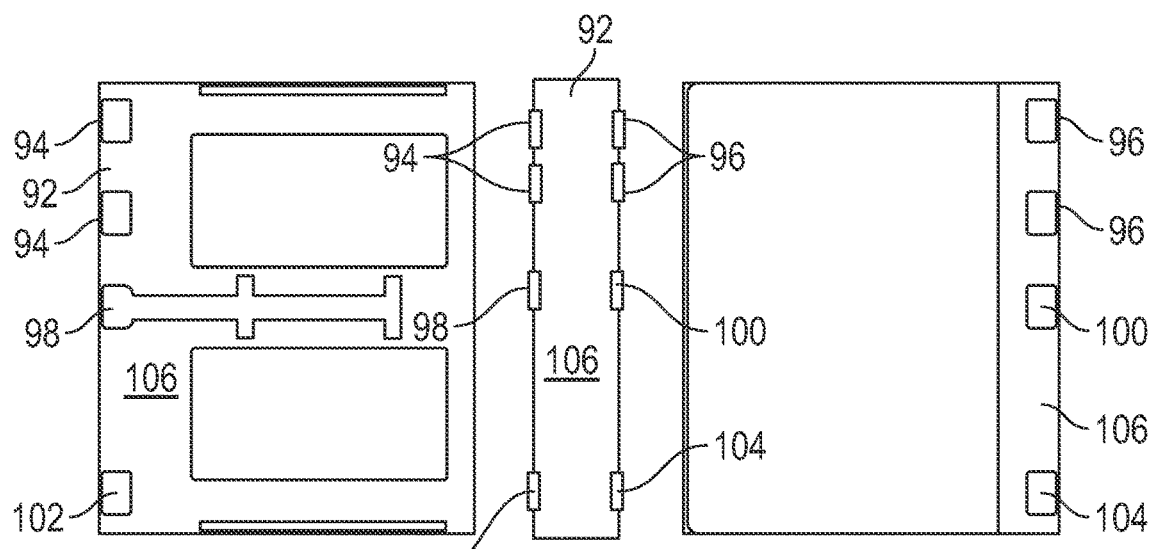
FIG. 10

IMMERSION DIRECT COOLING MODULES

CROSS REFERENCE TO RELATED APPLICATIONS

This document claims the benefit of the filing date of U.S. Provisional Patent Application 63/202,557, entitled "Immersion Dual Side Direct Cooling Module" to Jeon et al. which was filed on Jun. 16, 2022, the disclosure of which is hereby incorporated entirely herein by reference.

BACKGROUND

1. Technical Field

Aspects of this document relate generally to semiconductor packages, such as packages for semiconductor devices arranged in modules. More specific implementations involve packages for power semiconductor devices.

2. Background

Semiconductor packages work to establish electrical connections between a die and another electrical device. Semiconductor packages are also constructed to protect semiconductor die from ambient conditions like humidity, shock, vibration, or other environmental variables that could prevent the functioning of the die.

SUMMARY

Implementations of a semiconductor package may include one or more semiconductor die directly coupled to only a direct leadframe attach (DLA) leadframe including two or more leads; and a coating covering the one or more semiconductor die and the DLA leadframe where when the semiconductor package is coupled into an immersion cooling enclosure, the coating may be in contact with a dielectric coolant while the two or more leads extend out of the immersion cooling enclosure.

Implementations of semiconductor packages may include one, all, or any of the following:

Mold compound may be molded around the two or more leads and the mold compound may form a seal for the dielectric coolant.

The package may include a heat spreader coupled to the one or more semiconductor die.

The heat spreader may include pin fins.

The one or more semiconductor die may be included in a die module coupled directly to the DLA leadframe.

One or more of the two or more leads include a spring.

The spring may be included in mold compound molded around the two or more leads.

The spring may be located adjacent to the one or more semiconductor die.

Implementations of a semiconductor package may include two or more semiconductor modules where each semiconductor module may include one or more semiconductor die directly coupled to only a direct leadframe attach (DLA) leadframe including two or more leads; a coating covering the one or more semiconductor die and the DLA leadframe; and mold compound molded around the two or more leads of each of the two or more semiconductor modules. When the two or more semiconductor modules are coupled into an immersion cooling enclosure, the coating may be in contact with a dielectric coolant while the two or more leads of each of the two or more semiconductor module extend out of the immersion cooling enclosure.

Implementations of semiconductor packages may include one, all, or any of the following:

The mold compound may form a seal for the dielectric coolant.

The package may include a heat spreader coupled to the one or more semiconductor die.

The heat spreader may include pin fins.

The one or more semiconductor die may be included in a die module coupled directly to the DLA leadframe.

One or more of the two or more leads include a spring.

The spring may be included in mold compound molded around the two or more leads.

The spring may be located adjacent to the one or more semiconductor die.

A method of forming a semiconductor package may include directly coupling one or more semiconductor die to only a direct leadframe attach (DLA) leadframe including two or more leads; applying a coating covering the one or more semiconductor die and the DLA leadframe; and molding mold compound may be around the two or more leads to form a seal for a dielectric coolant included in an immersion cooling enclosure.

Implementations of a method forming a semiconductor package may include, one, all, or any of the following:

Molding mold compound may be around the two or more leads further may include molding one of after a reflow soldering process for the one or more semiconductor die or before a reflow soldering process for the one or more semiconductor die.

The method may include directly coupling the one or more semiconductor die to a heat spreader.

Directly coupling the one or more semiconductor die further may include where the one or more semiconductor die may be included in a die module which may be coupled directly to only the DLA leadframe.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 9 is a perspective front view of an implementation of DLA leadframe along with a heat spreader with semiconductor die coupled thereto;

FIG. 10 are top, side, and bottom views of an implementation of a die module comprising multiple die therein;

FIG. 19 is a front view of an implementation of a DLA leadframe with die and a coating shown in partial see-through.

DESCRIPTION

This disclosure, its aspects and implementations, are not limited to the specific components, assembly procedures or method elements disclosed herein. Many additional components, assembly procedures and/or method elements known in the art consistent with the intended immersion direct cooling modules will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such immersion direct cooling modules, and implementing components and methods, consistent with the intended operation and methods.

Figure 1:
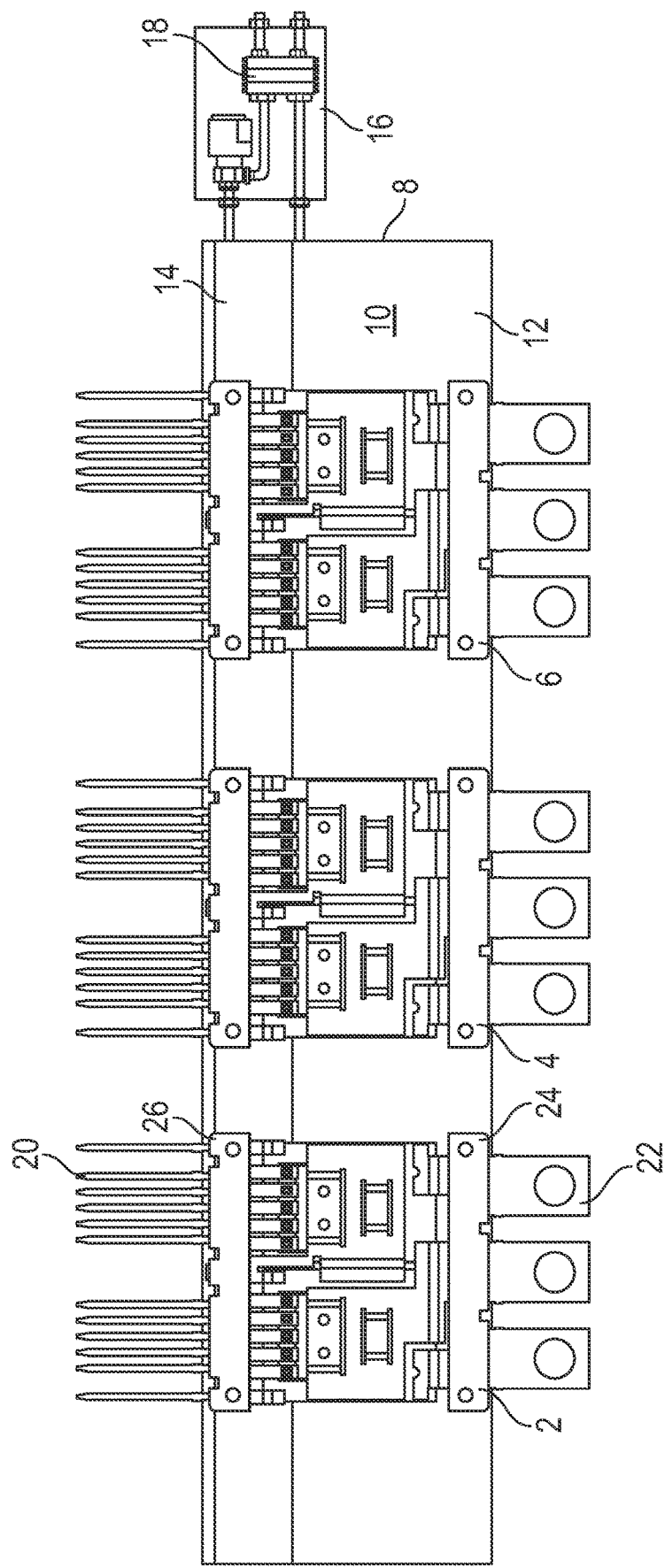
FIG. 1 is a side view of implementations of three semiconductor packages assembled in an immersion cooling enclosure.

Referring to FIG. 1, three implementations of semiconductor packages 2, 4, 6 are illustrated placed within an immersion cooling enclosure 8 that includes a coolant 10 therein. As illustrated, the immersion cooling enclosure 8 includes both liquid phase coolant 12 and vapor phase coolant 14 in this implementation. However, in other implementations, the coolant 10 may be only liquid phase in the immersion cooling enclosure 8. As used herein, "immersion cooling" includes where at least a portion of the semiconductor packages are immersed in a liquid phase of the coolant and thus includes situations where single phase or two phase coolant is employed in an immersion cooling enclosure. In various implementations, the immersion cooling enclosure 8 is included in a dual side direct cooling module, where coolant, whether liquid or vapor, is able to contact both sides of a semiconductor package mounted in the module. The immersion cooling enclosure 8 may be self-contained and a closed system without an outlet relying on ambient or external forced convection cooling of the outer surface of the enclosure to remove heat transferred from the coolant 10 (for both two phase and single phase coolant situations). In other implementations, the immersion cooling enclosure 8 may be coupled with a cooling exchanger which receives heated coolant 10 from the interior of the enclosure 8, removes heat therefrom, and then cycles the cooled coolant back to the immersion cooling enclosure. As illustrated in FIG. 1, a cooling exchanger 16 is illustrated that receives vaporized coolant 14 and then condenses it using heat exchanger 18 to return liquid coolant 12 to the enclosure 8. In other implementations, however, the cooling exchanger may only receive and cool liquid coolant from the immersion cooling enclosure even where two phases of the coolant are present in the enclosure. A wide variety of enclosure types and cooling exchange types may be constructed using the principles disclosed in this document. In particular implementations, the coolant used may be a chemically inert coolant. In other implementations, the coolant used may be a dielectric fluid. In some implementations, the coolant may be one of the inert and dielectric coolants marketed under the tradename FLUORINERT by 3M of St. Paul, Minnesota.

In FIG. 1, each semiconductor package 2, 4, 6 is mounted separately into the enclosure 8 and, for example using package 2, leads 20, 22 extend through openings in the enclosure 8 to allow electrical connections to be made with the semiconductor die in the package 2. In various implementations, the leads 20, 22 work both as a mechanical support for the semiconductor package 2 and as an electrical connection. In other implementations, however, additional mechanical support for the semiconductor package 2 may be provided by fixtures or other fastening/supporting devices provided in, on, and/or through the material of the immersion cooling enclosure 8. Mold compound molded around portions of the leads 20, 22 forms seals 24, 26 which act to prevent any flow or leakage of the coolant 10 out from around the leads 20, 22 during operation. Because of the use of the mold compound seals 24, 26, the various semiconductor package implementations disclosed herein may not include the use of mold compound or another heat sink around the package, but may simply include a direct leadframe attach (DLA) leadframe to which die are coupled covered by a coating material. In other implementations, a heat spreader may be included, but as the die may be directly coupled to the heat spreader and to the DLA leadframe, the need for separately soldered heat sinks to be coupled to an existing package design may be eliminated. In this document, a number of variations on these package structures and method implementations for forming them are discussed in further detail.

Figure 2:
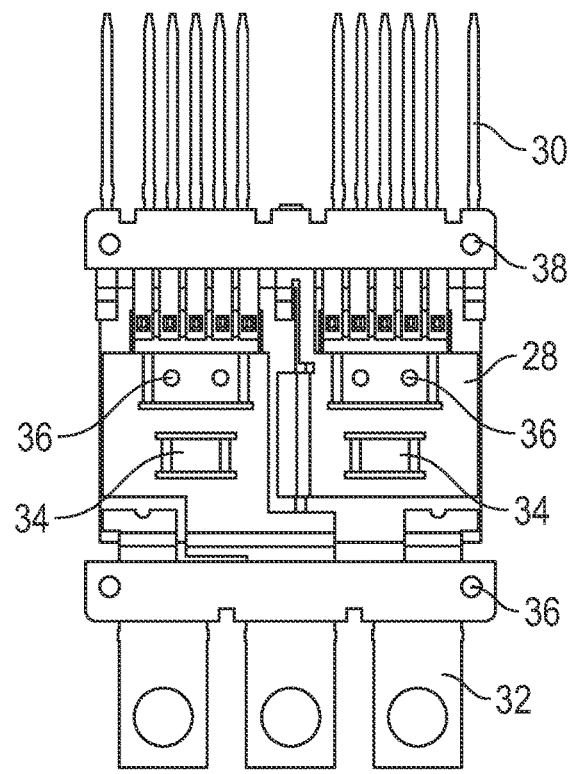
FIG. 2 is front view of an implementation of a direct leadframe attach (DLA) leadframe with leads extending therefrom.

Referring to FIG. 2, an implementation of a DLA leadframe 28 is illustrated that includes leads 30, 32. This DLA leadframe 28 does not have die attached thereto, but has two die attach regions 34, 36 defined on it to which semiconductor die will ultimately be coupled. This DLA leadframe 28 has mold compound seals 36, 38 molded around portions of the leads 30, 32 prior to the die bonding according to a pre-molding process which will be subsequently disclosed. This DLA leadframe 28 in particular method implementations may have the semiconductor die coupled to the die attach regions 34, 36 without the use of any other thermal transfer components (heat spreaders, heat sinks, etc.) allowing the heat from the semiconductor die to transfer, following application of a protective coating to be discussed further, directly to the coolant in which the DLA leadframe 28 contacts. In this way the size of the immersion cooling enclosure that contains the coolant can be made smaller than dual side cooling modules that utilize liquid flow that include separately bonded heat sinks and need additional dimensional size to incorporate seals between the two clamshell halves of the two outer portions of the liquid flow enclosure. The ability to cool in an immersion cooling setting without involving the use of additional process steps to bond heat sinks and seal outer portions of a liquid flow enclosure may result in reduced process costs and higher yield.

Figure 3:
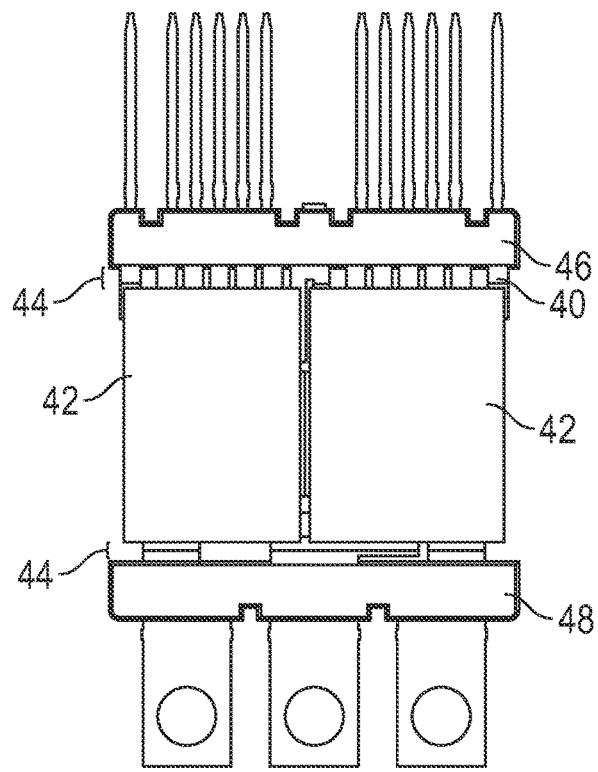
FIG. 3 is a front view of the DLA leadframe of FIG. 2 with a heat spreader and die coupled thereto.
Figure 4:
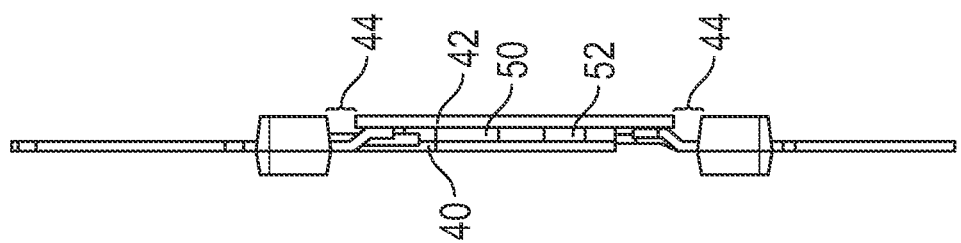
FIG. 4 is a side view of the assembly of FIG. 3.

FIG. 3 illustrates an implementation of a DLA leadframe 40 that has heat spreaders 42 and die (not shown in the figure as they are covered by the heat spreader 42) coupled thereto. In this implementation, the heat spreader takes the form of a flat portion of metallic material to which the die are bonded and which is then bonded with the die to the DLA leadframe 40 using a process which will be discussed hereafter. In this implementation, the mold compound seals 46, 48 have been formed after the bonding of the heat spreader and a gap 44 is present between an edge of the heat spreader and the closest edge of the mold compound seals 46, 48. FIG. 4 is a side view of the assembly implementation of FIG. 3 and shows the gap 44 along with the semiconductor die 50, 52 coupled between the heat spreader 42 and DLA leadframe 40. This view also shows how some of the leads 54, 56 included a portion that angles to contact the heat spreader 42 to provide electrical connections to a side of the semiconductor die 50, 52 via the heat spreader 42. FIG. 4 also illustrates the cross sectional thickness of the mold compound seals 46, 48 used to seal the coolant when the DLA leadframe 40 is assembled into an immersion cooling enclosure. As with the implementation in FIG. 2, a coating material (not shown in FIGS. 3 and 4) is applied to the heat spreader 42 and material of the DLA leadframe 40 to provide protection for the leadframe and the semiconductor die from the coolant. In some implementations the coating material does not have to be sufficiently thick to provide dielectric protection for electricity flowing through the leadframe/heat spreader because of the use of the immersion cooling enclosure and the use of a dielectric coolant. Because of this, the heat transfer rate between the heat spreader and the coolant may not be significantly impaired when compared to the heat transfer observed through use of a mold compound at a typical thickness over the DLA leadframe and other components.

Figure 6:
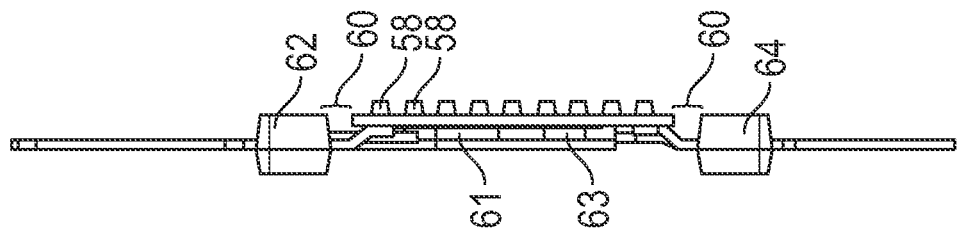
FIG. 6 is a side view of the assembly of FIG. 5.
Figure 5:
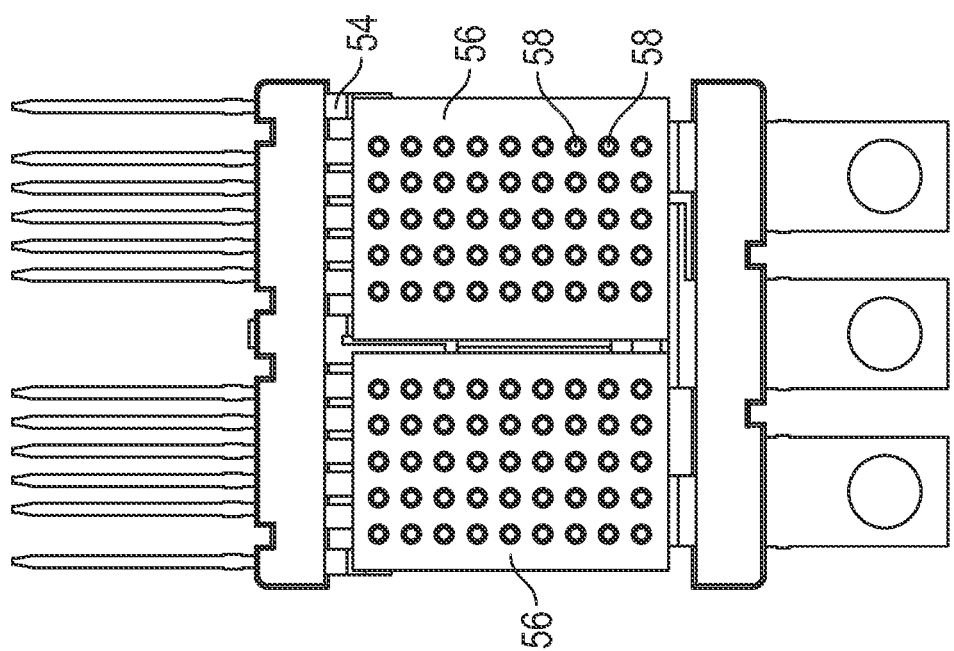
FIG. 5 is a front view of an implementation of a DLA leadframe with a pin fin heat spreader and die coupled thereto.

Referring to FIG. 5, another implementation of a DLA leadframe 54 is illustrated with heat spreaders 56 that contain pin fins 58 thereon. As illustrated in FIG. 6, the use of the pin fins 58 results in an increase in surface area of the heat spreaders 56 thereby increasing the heat transfer rate possible from the heat spreaders and the die 61, 63 bonded between the DLA leadframe 54 and the heat spreaders 56. In various implementations, the heat spreaders may include a wide variety of fins and other projection types and shapes, such as, by non-limiting example, pins, cones, frustoconical shapes, rectangular protections, curved projections, or any other three dimensional fin or pin shape. As with the implementation illustrated in FIGS. 3-4, a gap 60 is present between the edges of the heat spreaders 56 and the mold compound seals 62, 64. While the use of heat spreaders on one side of the DLA leadframes has been illustrated in this document, in other implementations, additional heat spreader(s) may be coupled to the largest planar side of the leadframes opposite the side to which the semiconductor die are coupled. In implementations where semiconductor die are coupled to both sides of the DLA leadframes, heat spreader(s) may also be used on both largest planar sides of the leadframes. The materials used for the heat spreaders, pin fin heat sinks, and DLA leadframes may be any of a wide variety of thermally/electrically conductive materials including, by non-limiting example, metals, metal alloys, alumina, copper, copper alloys, aluminum, aluminum alloys, or any other thermally conductive material.

Figure 8:
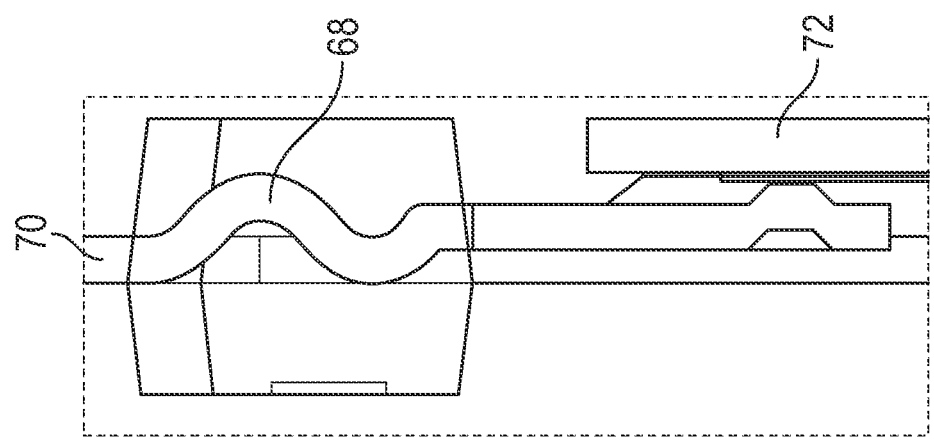
FIG. 8 is a side close up view of the indicated region 8 in FIG. 7.
Figure 7:
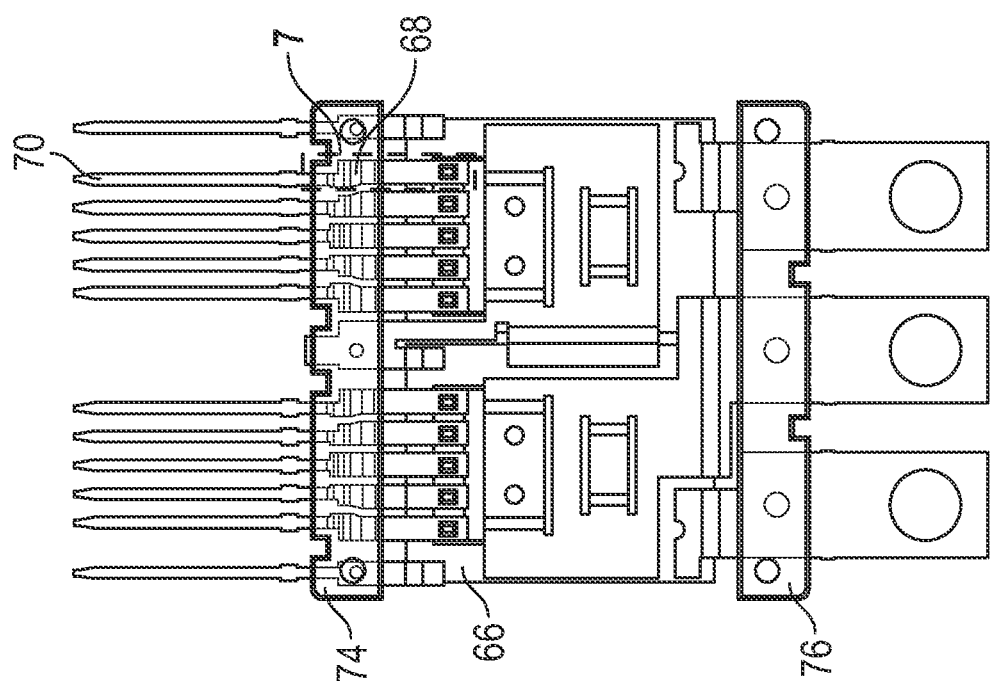
FIG. 7 is a rear view of an implementation of a DLA leadframe with die and a heat spreader attached thereto that include at least one lead with a spring.

Various implementations of DLA leadframes disclosed in this document may use a wide variety of leads. While in the figures in this document the use of leads at both ends of the leadframes is illustrated, leads may be present on only one side of the leadframes. Also, while the use of multiple leads on a side is illustrated, in other implementations, only one lead or two leads may be utilized in various DLA leadframe implementations. FIG. 7 illustrates a DLA leadframe 66 that includes a lead 70 that has a spring/spring portion 68 formed therein. FIG. 8 is a detail side view of the region marked 7 in FIG. 7 showing how in this implementation, the shape of the spring portion 68 takes the form of an S curve. However, in other implementations, the spring portion 68 may include any of a wide variety of other shapes, including, by non-limiting example, W curves, C curves, L curves, Z curves, curves, elbows, elongated portions, thinned portions, coiled portions or any other shape capable of accommodating movement of the lead. In some implementations, as illustrated in FIG. 8, a portion of the lead 70 may include an angled portion that allows the lead to directly contact the semiconductor die 72 rather than electrically connect to the die through a heat spreader as previously illustrated. The mold compound seals 74, 76 in FIGS. 7-8 are illustrated in partial see-through so that the interior structure of the leads is made visible that ordinarily is covered by the mold compound.

Figure 14:
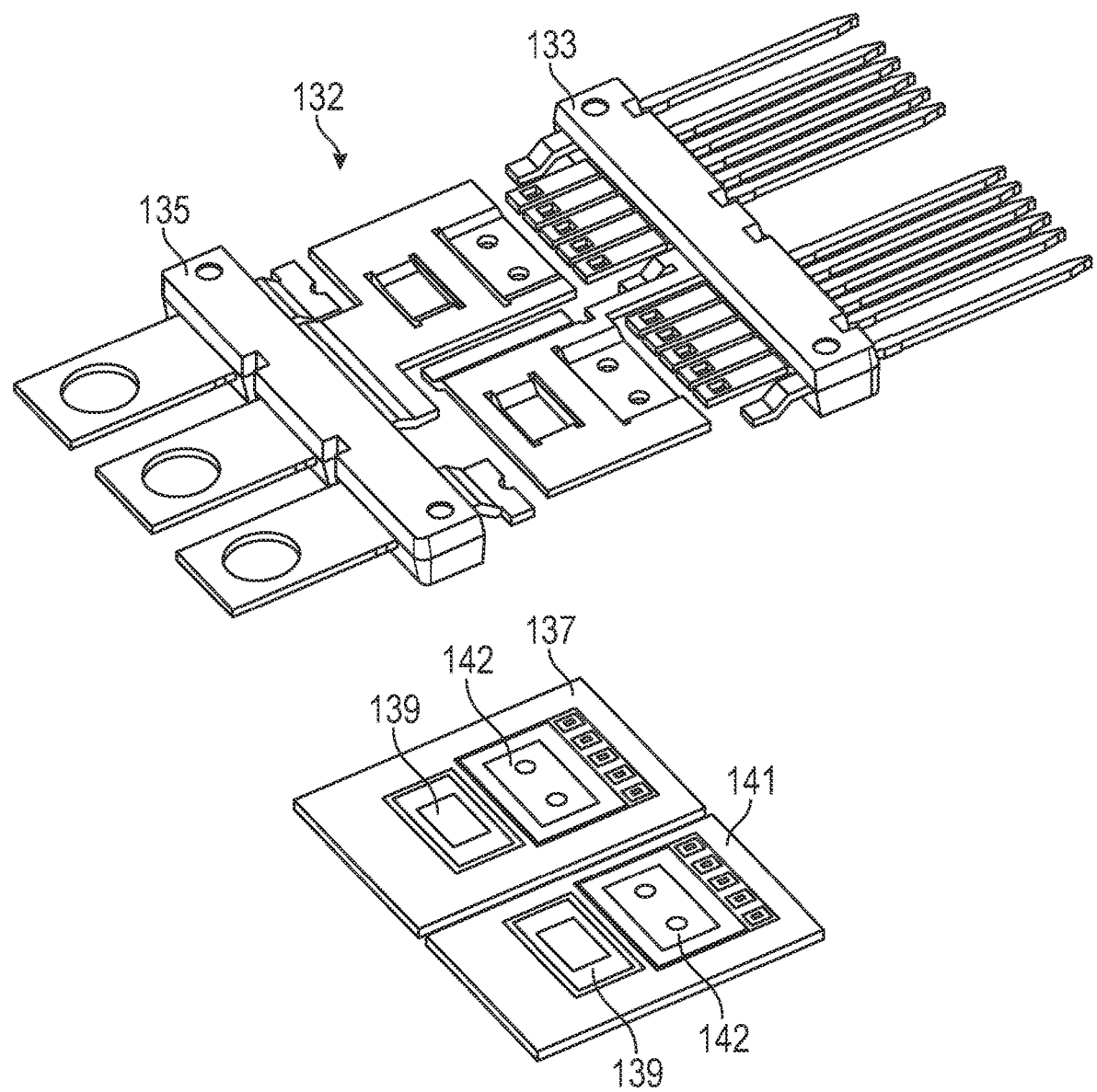
FIG. 14 is a perspective front view of an implementation of DLA leadframe with pre-molded mold compound coupled over the leads along with a heat spreader with semiconductor die coupled thereto.

Referring to FIG. 9, an implementation of a DLA leadframe 78 is illustrated prior to application of mold compound seals in a perspective view so that the various curved portions of the leads 80, 82 are visible. The DLA leadframe 78 is illustrated adjacent two heat spreaders 84, 86 to which semiconductor die 88, 90 have been coupled. While the semiconductor die 88, 90 are different semiconductor die types in FIG. 9, in other implementations, they may be the same die type. Any of a wide variety of semiconductor die may be employed as well, including, by non-limiting example, power semiconductor die, processors, memory, IGBTs, diodes, rectifiers, metal-oxide field effect transistors (MOSFETs), gallium arsenide devices, high-electron-mobility transistors (HEMTs), passive components (capacitors, resistors, inductors, etc.) or any other semiconductor device or component. FIG. 9 illustrates discrete semiconductor die 88, 90 each coupled to the heat spreaders 84, 86 and then to the DLA leadframe 78. FIG. 14 illustrates DLA leadframe 132 that has mold compound seals 133, 135 pre-applied alongside heat spreaders 137, 141 that have semiconductor die 142, 139 coupled thereto, similar to the view in FIG. 9.

In contrast with the discrete semiconductor die illustrated in FIG. 9, FIG. 10 illustrates an implementation of a die module 92 in three views, which, from left to right, are a top view, side view, and bottom view. The die module 92 contains one or more semiconductor die which have been mechanically and electrically coupled together to form a discrete module with its own leads. In the implementation illustrated in FIG. 10, leads 94 on the top and leads 96 on the bottom are used for temperature sensing for the semiconductor die included therein. Leads 98 on the top and 100 on the bottom are used to electrically connect with the gate(s)

of the semiconductor die included in the die module 92. Leads 102 on the top and 104 on the bottom are used to electrically connect with the source sense of the semiconductor die included in the die module 92. Mold compound 106 is formed around the semiconductor die leaving the exposed leads/pads visible and providing mechanical support for the die. While a particular implementation of a die module 92 is illustrated in FIG. 10, this is merely for the exemplary purposes of this disclosure as a wide variety of die modules containing any desired number of semiconductor die with any desired number of leads and mechanically supported using mold compound, leadframes, or combinations of mold compound and leadframes may be constructed using the principles disclosed herein. The die module 92 can be coupled on a heat spreader or coupled to a DLA leadframe in a similar way as the individual die in this document, so in every implementation disclosed herein, a die module could be used in place of the discrete semiconductor die illustrated.

Figure 13:
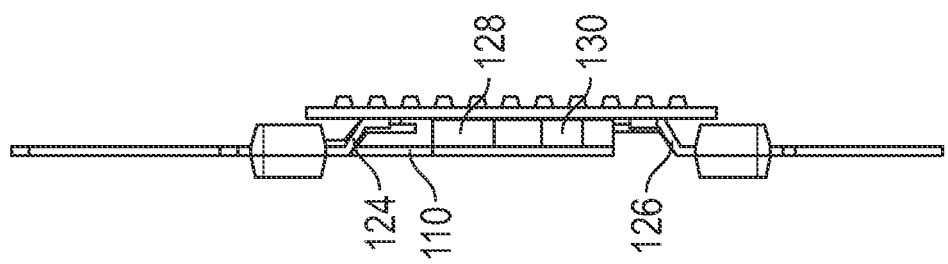
FIG. 13 is a side view of the assembly of FIG. 12.
Figure 12:
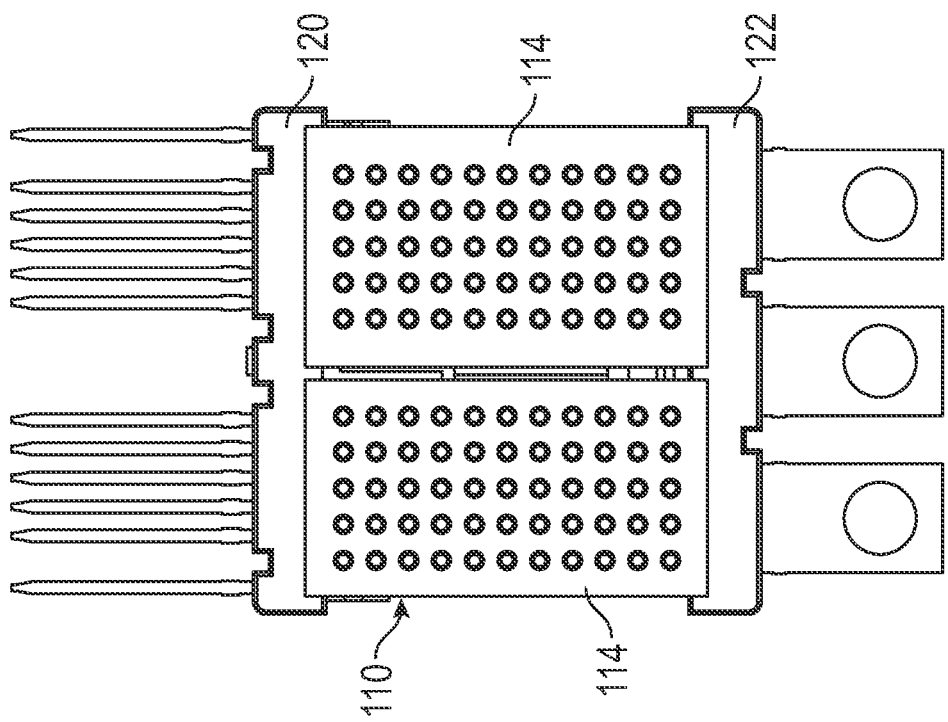
FIG. 12 is a front view of an implementation of a DLA leadframe with a pin fin heat spreader that extends over the mold compound coupled around the leads thereof.
Figure 11:
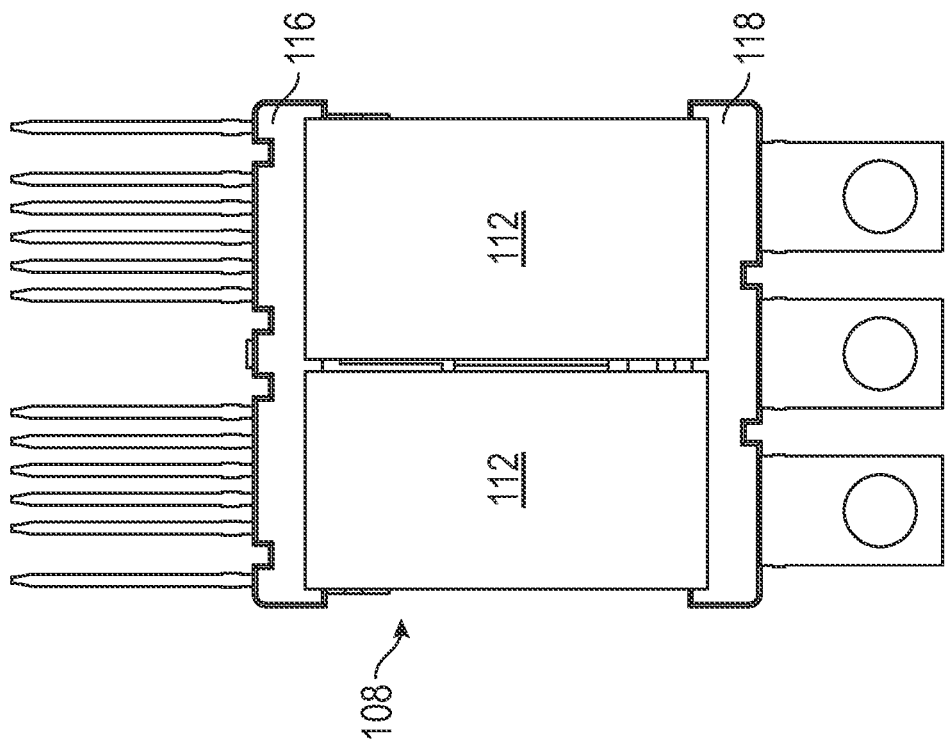
FIG. 11 is a front view of an implementation of a DLA leadframe with a heat spreader that extends over the mold compound coupled around the leads thereof.

Referring to FIGS. 11-13, implementations of DLA leadframes 108, 110 that have heat spreaders 112, 114 that extend over the material of the respective mold compound seals 116, 118 and 120, 122 is illustrated. These heat spreaders 112, 114 may be used with DLA leadframes where the mold compound seals are either pre-formed or formed during the assembly process as will be disclosed herein. The ability to use these larger heat spreaders 112, 114 that do not have a gap between the mold compound seals 116, 118, 120, 122 means that a larger surface area for both the planar heat spreader 112 and pin fin heat spreader 114 is available for heat transfer. The side view of the DLA leadframe 110 from FIG. 12 illustrated in FIG. 13 shows that extending the heat spreaders involves increasing the length of the bent portions of the leads 124, 126 to provide additional clearance and adjusting the thickness of the semiconductor die 128, 130. Adjusting the thickness of the semiconductor die 128, 130 may involve thinning the semiconductor die to a desired thickness thicker than that used in previously illustrated implementations or may involve, by non-limiting example, increasing a thickness of a die attach film, die bonding material, use of a spacer, or any combination thereof.

Figure 15:
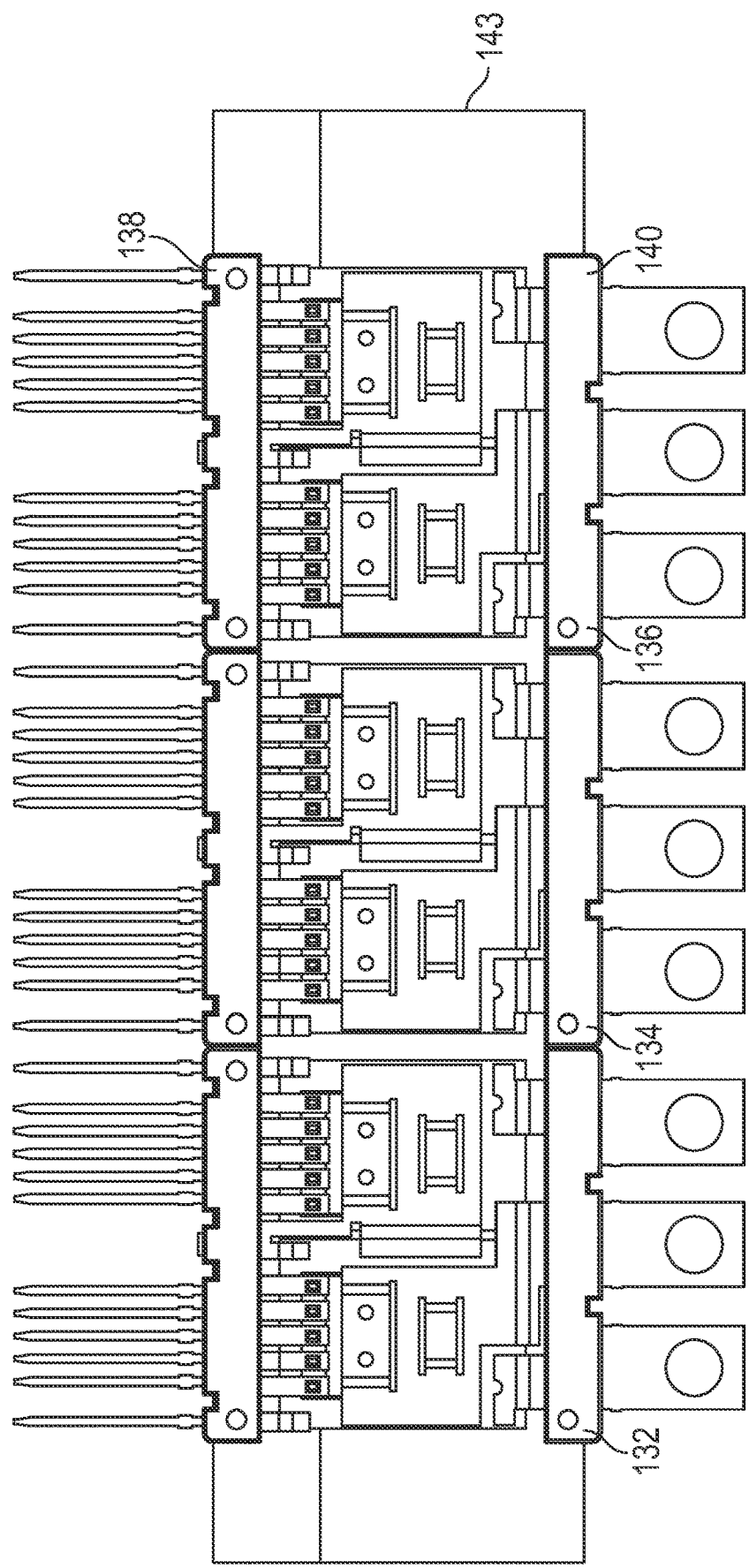
FIG. 15 is a front view of an implementation of three DLA leadframes molded together using mold compound assembled in an immersion cooling enclosure.

Returning to FIG. 1, three physically separate semiconductor packages 2, 4, 6 are illustrated installed in an immersion cooling enclosure 8. In contrast, FIG. 15 illustrates three semiconductor modules 132, 134, 136 physically and collectively coupled together through the same mold compound seals 138, 140 in immersion cooling enclosure 143. This implementation illustrates how the ability to couple semiconductor modules together through the mold compound seals can allow for the formation of semiconductor packages that contain various desired numbers of modules. For example, the three semiconductor packages of FIG. 1 could collectively form a half bridge assembly when installed into the immersion cooling enclosure 8. However, the semiconductor package implementation illustrated in FIG. 15 could form a three phase inverter module. The ability to market semiconductor packages formed from multiple DLA leadframes as a single package allows for more compact packages and use of space in immersion cooling enclosures. It also allows customers to order and receive packages that have a desired number of and arrangement in the package of DLA leadframe modules, permitting customizing in some implementations. The mold compound seals 138, 140 may be formed using any method disclosed in this document.

Figure 16:
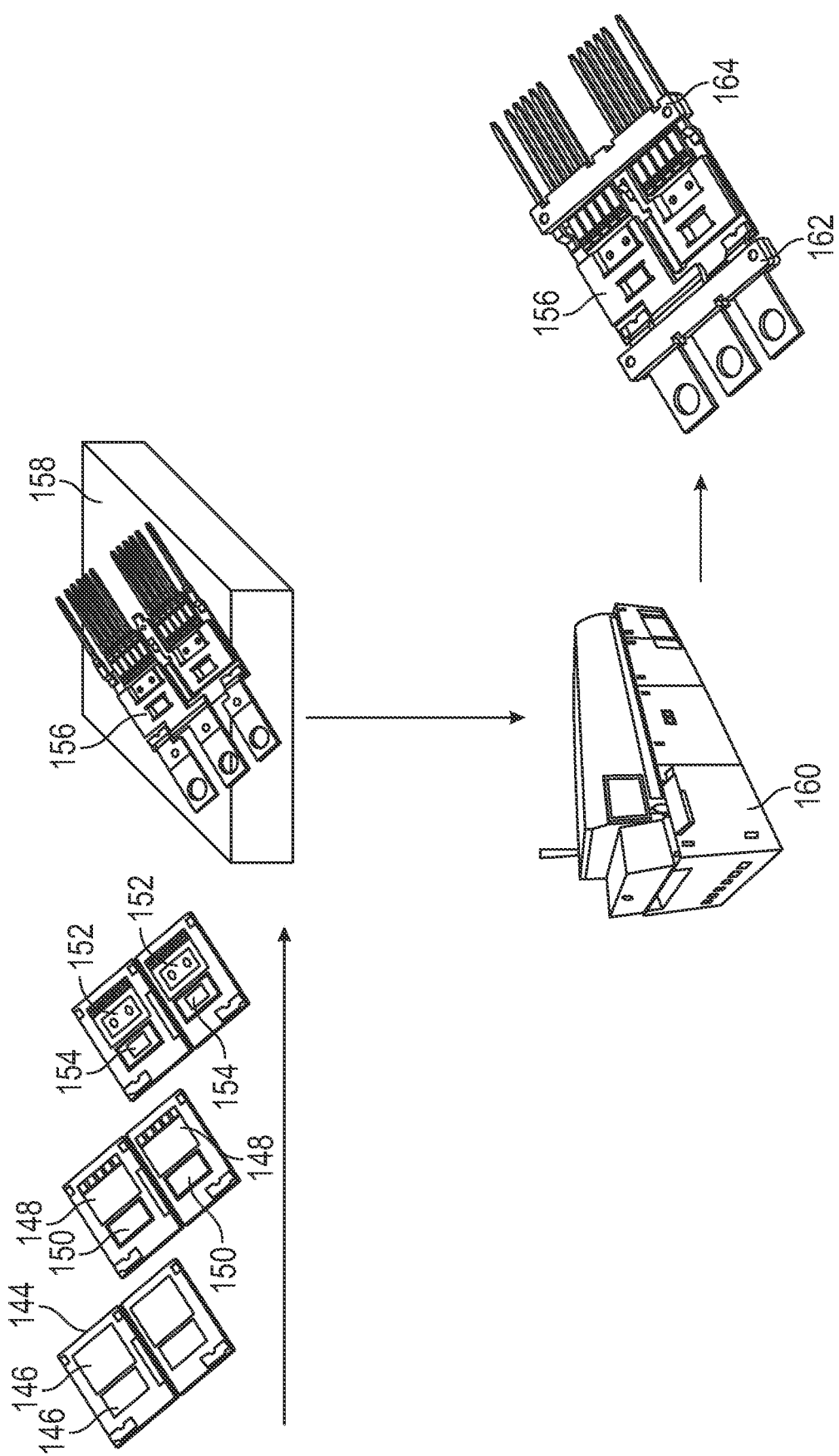
FIG. 16 is a flow diagram with examples of components at various steps of an implementation of a method of forming a semiconductor package.

Referring to FIG. 16, a flow diagram with various components of a semiconductor package at various points in an implementation of a method of forming a semiconductor package is illustrated. In the figure, heat spreaders 144 (which may be any type disclosed in this document) are illustrated with solder printed areas 146. Semiconductor die 148, 150 are then mounted to the solder printed areas 146 as illustrated in the next diagram to the right. Additional solder printed areas 152 are then printed on the surface of the semiconductor die as illustrated in the next diagram to the right. The heat spreaders 144 and a DLA leadframe 156 are then bonded together at the semiconductor die 148, 150 using a jig 158 designed to align the heat spreaders and DLA leadframe. Following the use of the jig 158, the assembly is placed in a reflow device like reflow oven 160 to undergo reflow soldering and/or flux cleaning. Following reflow and flux cleaning, the assembly then undergoes a molding/partial molding process where the mold compound seals 162, 164 are formed around the leads of the DLA leadframe 156. Following (or prior to, in various method implementations) a coating step is carried out that applies a coating material like any disclosed to this document over desired portions of the DLA leadframe and/or heat spreaders. The resulting semiconductor package is now ready for installation into an immersion cooling enclosure. This particular method implementation is referred to as a mold-after process. This method implementation also involves the use of a single flat heat spreader with one pass through a jig. This method implementation could be used with heat spreaders that are sized to create a gap with the mold compound seals and with heat spreaders that are sized to not create a gap with the mold compound.

Figure 17:
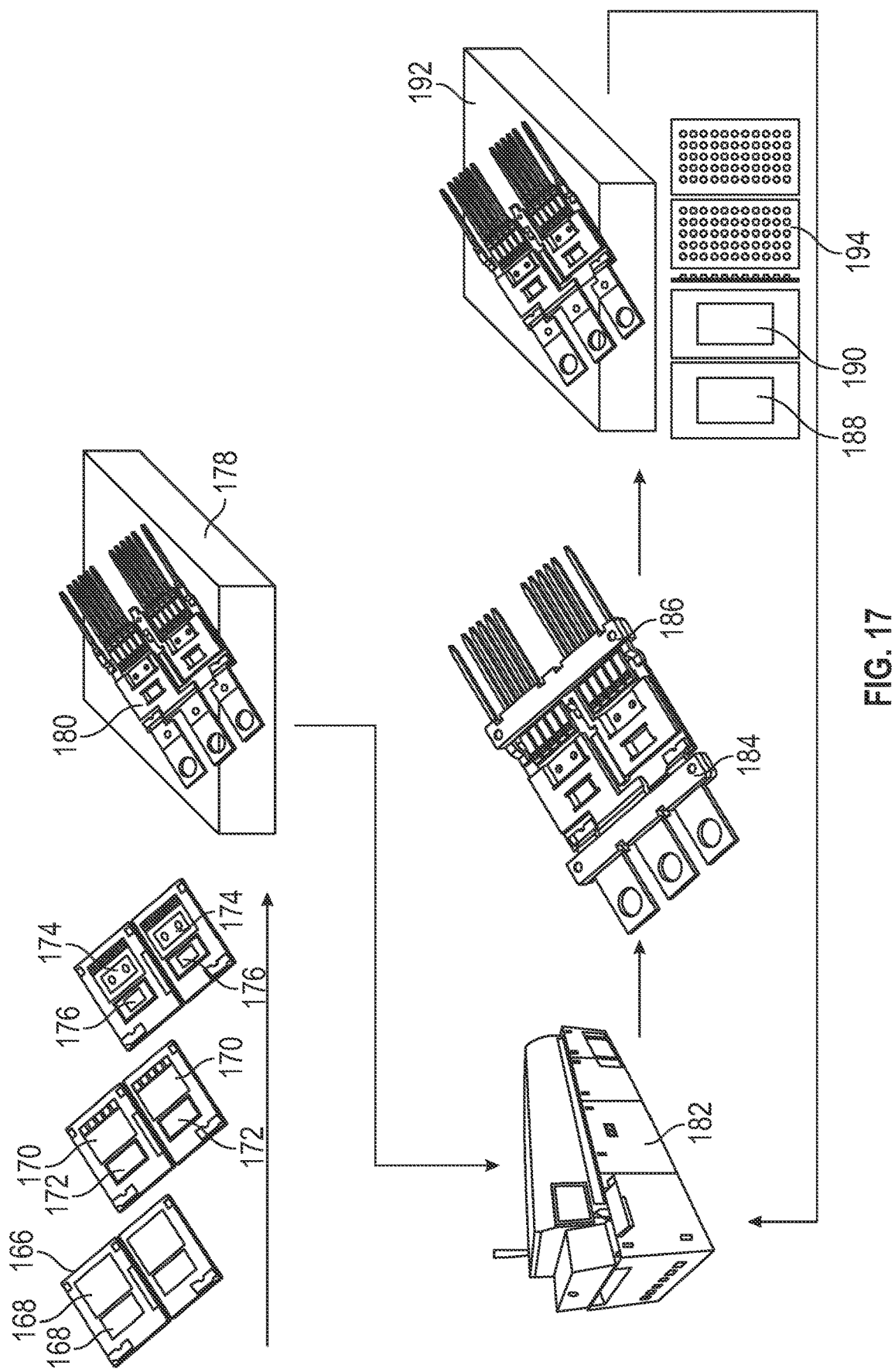
FIG. 17 is a flow diagram with examples of components at various steps of an implementation of another method of forming a semiconductor package.

Referring to FIG. 17, another implementation of a method of forming a semiconductor package is illustrated with various components drawn after various portions of the method are completed. Heat spreaders 166 are first illustrated following solder printing of solder printed areas 168. Semiconductor die 170, 172 are then coupled to the solder printed areas as illustrated in the next figure to the right. Additional solder printed areas 174, 176 are then formed on the semiconductor die as illustrated in the next figure to the right. A jig 178 configured to align the heat spreaders 166 to DLA leadframe 180 is then used to couple the heat spreaders 166 to the leadframe prior to reflow soldering and/or flux cleaning illustrated by reflow oven 182. Mold compound seals 184, 186 are then formed around leads of the DLA leadframe 180 using a partial molding process followed by a solder printing process to the side of the heat spreaders that is opposite the side of the semiconductor die 170, 172 to form solder printed areas 188, 190. An additional jig 192 is then used to align an additional flat heat spreader and/or a pin fin heat sink 194 to the heat spreaders prior to reflow and cleaning by reflow oven 182. In this way, an additional pin fin heat sink or flat heat spreader can be coupled to the heat spreader 166. In various method implementations, similar processes could be used to couple an additional pin fin heat sink or flat heat spreader to the side of the DLA leadframe 180 opposite the side the semiconductor die were coupled to or to couple two heat spreaders with die at the same time or in separate steps. A coating step prior to or after molding is also included in various method implementations similar to the method implementation illustrated in FIG. 16. A wide variety of method versions and variations may be constructed using the principles disclosed in this document.

A variation of the method implementations illustrated in FIGS. 16 and 17 may be carried out by using a DLA leadframe at the jig step that already has mold compound seals formed thereon. This method implementation is referred to as a pre-molding method which may allow for some process efficiency/reduction of thermal budget as the mold compound forming step does not require the presence of the semiconductor die to be in place. Such a method variation may be utilized in either method implementation disclosed in FIGS. 16 and 17 and the others disclosed herein.

Figure 18:
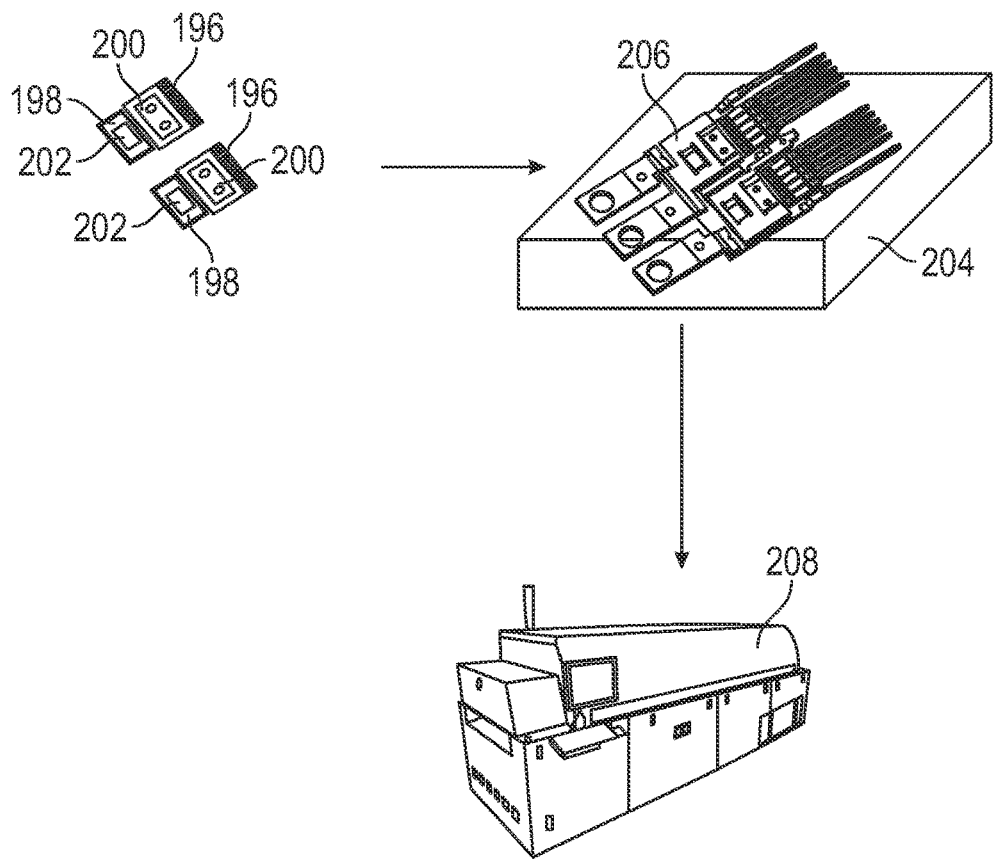
FIG. 18 is a flow diagram with examples of components at various steps of an implementation of another method of forming a semiconductor package.
Figure 19:
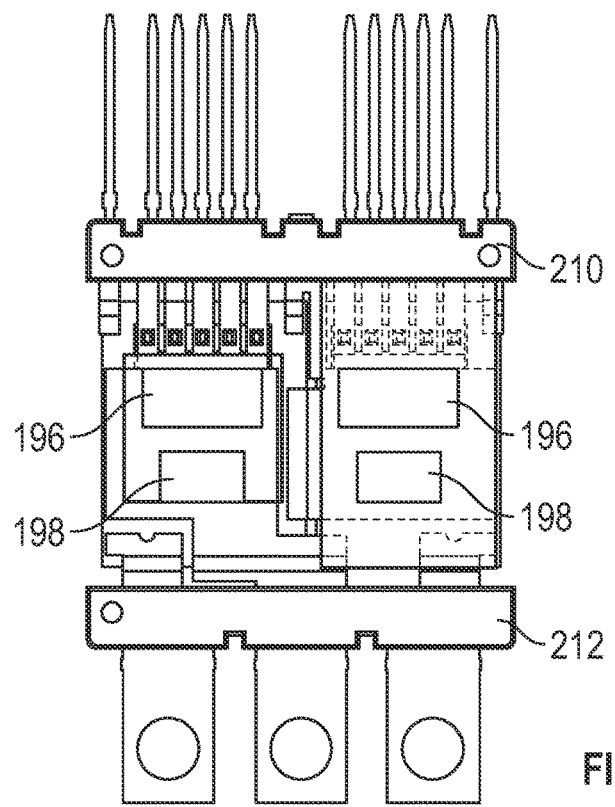

Referring to FIG. 18, an implementation of a method of forming a semiconductor package is illustrated that does not include a heat spreader. In this implementation, the semiconductor die 196, 198 are prepared through printing of solder printed regions 200, 202 for aligning using jig 204 with a DLA leadframe 206. The resulting assembly is then reflowed and cleaned (as necessary) as indicated by reflow oven 208. Following the reflowing of the die, a coating step is carried out to apply a coating to just the semiconductor die, the semiconductor die and portions of the adjacent DLA leadframe, or to the semiconductor die and all of the DLA leadframe that will be exposed to the coolant. A molding step is then carried out to form mold compound seals 210, 212 like those illustrated in the other method implementations disclosed herein. The resulting semiconductor package illustrated in FIG. 19 thus does not include a head spreader or pin fin heat sink, but relies on heat transfer directly from the semiconductor die 196, 198 (through the coating) to the immersion coolant. Because the thickness of the coating can be set to be thinner than would ordinarily be possible were immersion cooling in a dielectric coolant not being used (i.e., thicknesses less than the breakdown voltage of the coating at the operational voltage of the packages) better heat transfer than is possible using fully molded packages may be possible in this operating environment.

Figure 20:
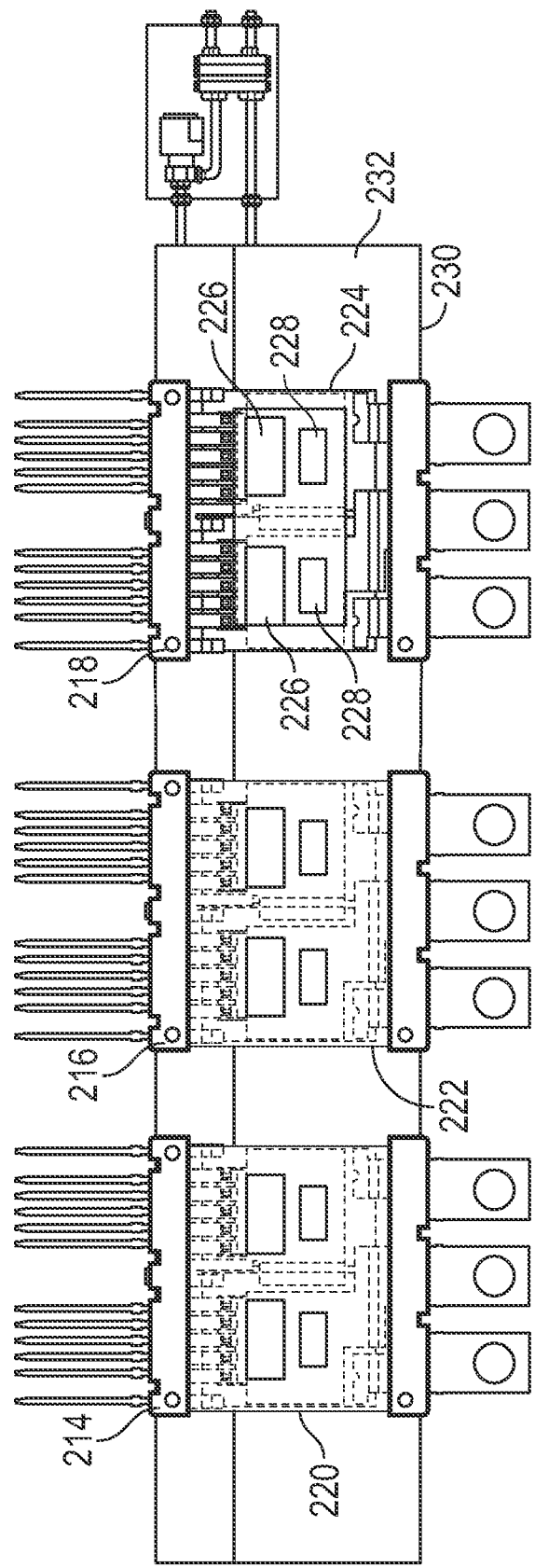
FIG. 20 is a front view of implementations of three DLA leadframes with die and a coating shown in partial see-through installed in an immersion cooling enclosure.

Referring to FIG. 20, three semiconductor packages 214, 216, 218 are illustrated following assembly with the structure of a coating material 220, 222, 224 illustrated in partial see through view. For the semiconductor packages 214, 216, the coating material 220, 222 covers the exposed material of the DLA leadframe, semiconductor die, and any heat spreader(s) used in the package. In the semiconductor package 218, the coating material 224 covers just a region of the DLA leadframe surrounding the semiconductor die 226, 228, leaving portions of the DLA leadframe exposed to the coolant 232 when placed in the immersion cooling enclosure 230. A wide variety of coating configurations covering all or various exposed portions of the package assemblies can be constructed using the principles disclosed herein.

The coating 220, 222, 224 can provide a large number of effects, such as, by non-limiting example, corrosion protection; ion gettering to extend longevity; physical protection during assembly; mechanical protection from coolant flow across the surface; particle/flake protection from particles from the enclosure, package, and/or assembly debris; and other positive effects resulting from protection of the material of the DLA leadframe and/or semiconductor die from the coolant 232.

While the coating 220, 222 is illustrated in FIG. 20 as being applied to all coolant-exposed surfaces of the packages 214, 216, in other implementations, one, all, or any number of the surfaces/sides of the packages 214, 216 may be coated. The use of the coating may also allow for protection of wirebonds formed on/to the DLA leadframes as the coating may fully cover the wirebonds and mechanically and physically protect them from coolant flow and particles. The use of the coating may also assist with repairing of any components of the package during assembly as components can be tested individually first prior to full assembly. While a single layer of coating material is illustrated in FIG. 20, multiple layers of coating material(s) may be applied in various implementations each made of the same or different materials. The coating may be formed of any of a wide variety of materials, including, by non-limiting example, epoxies, novolac resins, polymer films, aluminum oxide, titanium nitride, mold compound, any combination thereof, or any other material capable of being applied to the printed circuit board and resistant to the coolant material. In particular implementations, the ability to use aluminum oxide and/or titanium nitride as the coating may result in a thin film that provides adequate protection in the environment of the immersion cooling enclosure while facilitating additional heat transfer from the printed circuit board itself. In various implementations where aluminum oxide and/or titanium nitride are used in the coating, the thickness of the coating may be, by non-limiting example, between about 1 micron to about 5 microns, between about 1.5 microns to about 3 microns, or about 1.5 microns.

In certain method implementations, where the coating has two or more layers, multiple application steps may be sequentially carried out (along with a corresponding number of curing/drying steps). For example, a gel-type material may be applied in a first coating process followed by application of a mold compound through a molding process to form a two layer coating material. In some implementations, the application process for the coating may be a printing process. In other implementations, the application process may be a molding process. In other implementations, the coating may be applied using, by non-limiting example, spraying, dipping, dispensing, chemical vapor deposition, sputtering, physical vapor deposition, film application, or any other method for forming a layer of material over a leadframe, heat spreader, and/or semiconductor die.

In various semiconductor package implementations, while the pin fin heat spreaders/flat heat spreaders illustrated herein are illustrated as being suspended in the coolant, one or more of the pin fin heat spreaders/flat heat spreaders may contact the wall(s) of the immersion cooling enclosure. In some, the heat spreaders may be directly coupled with/through the walls through screwing/bonding; in others the heat spreader(s) may merely be in physical contact with the wall(s) of the immersion cooling enclosure. In such implementations, where sufficient mechanical support is available by/against the walls of the immersion cooling enclosure using the heat spreaders, no additional fixture or attaching mechanism may be used to further secure the semiconductor package therein. Also, in such implementations, additional conductive heat transfer is possible to the wall(s) of the immersion cooling enclosure. A wide variety of configurations of heat spreaders for various semiconductor package implementations that involve contact with/bonding with the wall(s) of the immersion cooling enclosure may be devised using the principles disclosed in this document.

Because of the use of DLA substrates for the various package implementations disclosed herein, no direct bonded copper (DBC) or integrated metal substrates (IMS) may be needed to form the packages. The use of immersion cooling may enable dual sided cooling of each package which does not need the additional thermal performance of use of DBC or IMS substrates. This can have the effect of reducing package cost and manufacturing steps. Improved junction to foot thermal resistance (RthJF) can also be observed where two phase immersion cooling is utilized due to increased cooling efficiency.

In places where the description above refers to particular implementations of immersion direct cooling modules and implementing components, sub-components, methods and sub-methods, it should be readily apparent that a number of modifications may be made without departing from the spirit thereof and that these implementations, implementing components, sub-components, methods and sub-methods may be applied to other immersion direct cooling modules.

What is claimed is:

1. A semiconductor package comprising:
one or more semiconductor die directly coupled to only a direct leadframe attach (DLA) leadframe comprising two or more leads; and
a coating covering the one or more semiconductor die and the DLA leadframe;
wherein when the semiconductor package is coupled into an immersion cooling enclosure, the coating is in contact with a dielectric coolant while the two or more leads extend out of the immersion cooling enclosure.

2. The package of claim 1, wherein mold compound is molded around the two or more leads and the mold compound forms a seal for the dielectric coolant.

3. The package of claim 1, further comprising a heat spreader coupled to the one or more semiconductor die.

4. The package of claim 3, wherein the heat spreader comprises pin fins.

5. The package of claim 1, wherein the one or more semiconductor die are comprised in a die module coupled directly to the DLA leadframe.

6. The package of claim 1, wherein one or more of the two or more leads comprise a spring.

7. The package of claim 6, wherein the spring is comprised in mold compound molded around the two or more leads.

8. The package of claim 6, wherein the spring is located adjacent to the one or more semiconductor die.

9. A semiconductor package comprising:
two or more semiconductor modules, each semiconductor module comprising:
one or more semiconductor die directly coupled to only a direct leadframe attach (DLA) leadframe comprising two or more leads;
a coating covering the one or more semiconductor die and the DLA leadframe; and
mold compound molded around the two or more leads of each of the two or more semiconductor modules;
wherein when the two or more semiconductor modules are coupled into an immersion cooling enclosure, the coating is in contact with a dielectric coolant while the two or more leads of each of the two or more semiconductor module extend out of the immersion cooling enclosure.

10. The package of claim 9, wherein the mold compound forms a seal for the dielectric coolant.

11. The package of claim 9, further comprising a heat spreader coupled to the one or more semiconductor die.

12. The package of claim 11, wherein the heat spreader comprises pin fins.

13. The package of claim 9, wherein the one or more semiconductor die are comprised in a die module coupled directly to the DLA leadframe.

14. The package of claim 9, wherein one or more of the two or more leads comprise a spring.

15. The package of claim 14, wherein the spring is comprised in mold compound molded around the two or more leads.

16. The package of claim 14, wherein the spring is located adjacent to the one or more semiconductor die.

* * * * *